United States Patent
Matsumoto et al.

(10) Patent No.: US 6,686,107 B2
(45) Date of Patent: Feb. 3, 2004

(54) METHOD FOR PRODUCING A SEMICONDUCTOR DEVICE

(75) Inventors: Shunichi Matsumoto, Yokohama (JP); Yasuhiro Yoshitake, Yokosuka (JP); Takeshi Kato, Koganei (JP); Norio Hasegawa, Ohme (JP)

(73) Assignee: Hitachi, Ltd., Tokyo (JP)

( * ) Notice: Subject to any disclaimer, the term of this patent is extended or adjusted under 35 U.S.C. 154(b) by 79 days.

(21) Appl. No.: 09/943,140

(22) Filed: Aug. 31, 2001

(65) Prior Publication Data

US 2002/0081506 A1 Jun. 27, 2002

(30) Foreign Application Priority Data

Dec. 25, 2000 (JP) .......................... 2000-396903

(51) Int. Cl.$^7$ ............... G03F 9/00; G03C 5/00
(52) U.S. Cl. ................. 430/22; 430/30; 430/313
(58) Field of Search .................... 430/22, 30, 313

(56) References Cited

U.S. PATENT DOCUMENTS 4,690,880 A  *  9/1987 Suzuki et al. ............... 430/313
5,451,479 A  *  9/1995 Ishibashi .................... 430/22

FOREIGN PATENT DOCUMENTS

| JP | 7-029803 | 1/1995 |
| JP | 7-176468 | 7/1995 |
| JP | 2000-124125 | 4/2000 |

OTHER PUBLICATIONS

"Reticle Specific Compensation to Meet Production Overlay Requirements for 64 MB and Beyond", R.Rogoff et al, SPIE vol. 2197, pps. 781–790.

* cited by examiner

*Primary Examiner*—Christopher G. Young
(74) *Attorney, Agent, or Firm*—Antonelli, Terry, Stout & Kraus, LLP

(57) ABSTRACT

A relative positional error is caused between an alignment mark and a device area on a mask due to an error inherent to the mask drawing apparatus, which causes an alignment error in the device area even when alignment upon exposure has no problem. Then, according to this invention, a relative positional error between the alignment mark and the device area on the mask is measured in an off line manner, the result of measurement is set upon exposure as a correction value to an exposure device thereby correcting the mask drawing error to reduce alignment errors in the device area.

20 Claims, 9 Drawing Sheets

METHOD FOR PRODUCING A SEMICONDUCTOR DEVICE

BACKGROUND OF THE INVENTION

1. Field of the Invention

This invention concerns an exposure mask and a method for producing a semiconductor device using the mask and, more in particular, it relates an exposure mask particularly suitable to improve the accuracy of alignment in the exposure step and a method for producing a semiconductor device.

2. Related Art

In the production for a semiconductor device, a circuit pattern for the semiconductor device is formed by transferring a pattern formed on an exposure mask (hereinafter referred to as a mask) on a semiconductor wafer coated with a photoresist (hereinafter referred to as a wafer). The semiconductor device comprises a plurality layers of circuit patterns and exposure of a circuit pattern of a certain layer needs positional alignment with a circuit pattern of a lower layer (alignment).

FIG. 5 is a constitutional view of a step and repeat type exposure system. A wafer 55 is placed on a wafer stage 54 and a reference mark plate 557 is fixed on the wafer stage 54 near the wafer 55. Then, images of a pattern on a mask 512 are projected and exposed by an exposure light from an illumination optical system not illustrated to each of shot regions on the wafer 55 by way of a projection optical system 58. In this case, since the wafer stage 54 is driven along a wafer coordinate system, it is necessary to measure the position at the wafer coordinate system of the mask 512 and angle of rotation of the mask 512 to the wafer coordinate system. For this purpose, two alignment marks (reticule mark) 560R and 561R are formed opposed to each other near the pattern area of the mask 512, and two reference marks 560F and 561F are formed on the reference mark plate 557 at a distance equal with the designed distance for the reticule marks 560R and 561R on the wafer 5.

Further, alignment microscopes 558 and 559 are disposed above the reticule marks 560R and 561R on the mask 512 respectively. Each of the alignment microscopes 558 and 559 has an illumination light source (not illustrated) for emitting an alignment light at the same wavelength as that of the exposure light and a sensor (not illustrated) capable of observing the reticule mark on the mask 512 and the alignment mark on the wafer 55 (wafer mark) or the reference mark on the reference mark plate 557 simultaneously.

When exposure is conducted to the wafer 55 by the exposure device shown in FIG. 5, only the wafer stage 54 is moved in a step and repeat manner and images of a pattern on the mask 512 are exposed to each of shot regions of the wafer 55 respectively. In the exposure device described above, when a pattern image of the mask 512 is exposed further on the circuit pattern on the wafer 55 formed in the preceding step, it is necessary to correspond the wafer coordinate system defining the coordinate for each of the shot regions on the wafer 55 with the mask coordinate system defining the coordinate system for the pattern on the mask 512, that is, to take alignment.

The alignment is conducted, for example, by the following procedures. At first, after driving the wafer stage 54 to move the reticule mark plate 557 into an exposure field of the projection optical system 58, the amount of the positional displacement between the reticule mark 560R and the reference mark 561F is detected by one reticule alignment microscope 558 and determine the pattern position for the reticule 512 on the wafer coordinate system based on the amount of the positional displacement. Further, the wafer stage 54 is driven to move the reference mark 560F to the position for the reference mark 561F to detect the amount of positional displacement between the reticule mark 561R and the reference mark 560F by the reticule alignment microscope 559, to measure the angle of rotation of the reticule 512 in the wafer coordinate system. Then, the reticule 512 or the wafer stage 514 is rotated to correct the angle of rotation and correspond the wafer coordinate system with the reticule coordinate system.

Further, in FIG. 5, an off axis system alignment microscope 534 is disposed on the lateral side of the projection optical system 58 in order to detect the position for the wafer mark formed corresponding to each of the shot regions on the wafer 55. In this case, based on the position for the wafer mark detected by the alignment microscope 534, the corresponding shot region on the wafer 55 is set within the exposure region of the projection optical system 58. Accordingly, it is necessary to previously determine the amount of a base line that is a distance between the reference point in the exposure field (for example, center for exposure) of the projection optical system 58 and the reference point 62 in the observation region of the off axis system alignment microscope 534.

When the amount of the base lines is measured, the amount of positional displacement of conjugate images between the reticule marks 560R and 561R, and the reference marks 560F and 561F on the wafer stage 54 are measured and then, the wafer stage 54 is moved, for example, by an amount equal with the designed value for the amount of the base line, the amount of positional displacement between the reference point 562 and the corresponding reference mark on the reference mark plate 557 is measured by the alignment microscope 534, to determine the amount of the base line based on the amount of the positional displacement thereof.

Since each of the operations for alignment explained above is conducted by using the alignment mark formed on the mask, if the position for the alignment mark on the mask includes an error, it forms an alignment error of the wafer to be exposed as it is (alignment error between the pattern on the wafer formed in the succeeding step and the pattern on the wafer to be formed in the succeeding step), to possibly lower the yield of the semiconductor device.

Particularly, rapid development for the refinement of semiconductor devices in recent years, has brought about a problem that the error of the pattern position on the mask caused by mask drawing gives an undesired effect on the alignment accuracy upon exposure and inventions for the exposing method to reduce the effect have been proposed.

For example, Japanese Published Unexamined Patent Application Hei 7-176468 (Related Art 1) discloses an example of a scanning type projection exposure method of using a mask on which a plurality of alignment marks are formed in a scanning direction, measuring the positions for the marks on an exposure device and reducing the effect of the mask drawing error by the averaging effect for the result of measurement.

Further, Japanese Published Unexamined Patent Application Hei 7-29803 (Related Art 2) discloses an example of an exposure device adapted to determine the mask drawing error based on the measurement of the positions for a plurality of patterns on a mask by an exposure device and conduct scanning exposure while moving the mask or the wafer so as to correct the error upon exposure.

The prior arts 1 and 2 reduce the error by averaging the overall drawing errors of the mask but no consideration is taken on the relative positional error between the reticule alignment mark and the device area. Accordingly, they are not always satisfactory for the correction of the alignment error caused by reticule alignment.

Further, while the prior arts 1 and 2 measure the accuracy for the drawing position of the mask on the exposure device, since the exposure device has to be used for the operation other than exposure, this causes lowering of the throughput in the device production to bring about a problem, particularly, in multiplicity kind small lot production such as in system LSI using plural kinds and a number of reticules.

SUMMARY OF THE INVENTION

This invention provides a technique capable of solving the subject in the prior art described above and obtaining a desired alignment accuracy in a device area, even when the there is a relative positional error between the alignment mark on the mask and the device area, by measuring a relative positional error between alignment marks and a device area on the mask and setting the result of the measurement as a correction value upon exposure in the exposure device.

That is, in the exposure mask according to this invention, a relative positional displacement between the alignment marks and a device area formed on a substrate is measured and the data is appended as quality guarantee data.

Further, in the exposure mask according to this invention, measurement for the relative positional displacement between the alignment marks and the device area on the substrate is measurement for relative position between the alignment marks and marks for the measurement of alignment disposed on four corners of a device area respectively.

Further, in the exposure mask according to this invention, the result of measurement for the relative positional displacement between the alignment marks and the device area is on the substrate expressed by the amount of rotation and the amount of shifting of the device area to the alignment marks. This enables to facilitate the production for a semiconductor device according to this invention shown above.

Further, a method for producing a semiconductor device according to this invention comprises measuring a relative positional displacement between an alignment mark and a device area on an exposure mask and correcting alignment by using the result of measurement upon exposure.

Further, in the method for producing a semiconductor device according to this invention, measurement for relative positional displacement between the alignment and the device area on the exposure mask is measurement for the relative position between the alignment marks and the marks for measurement of alignment disposed respectively at four corners of the device area.

Further, in the method for producing a semiconductor device according to this invention, measurement for relative positional displacement between the result of the alignment marks and the device area on the exposure mask is expressed by the amount of rotation and the amount of shifting of the device area to the alignment marks. This enables to facilitate feedback to the alignment correction upon exposure.

Further, in the method for producing a semiconductor device according to this invention, measurement for relative positional displacement between the alignment marks and the device area on the exposure mask is conducted in an off line manner by using a device other than the exposure device. Since the measurement is conducted in the off line manner, alignment accuracy can be improved giving no undesired effect on the throughput in the exposure step.

These and other objects, features and advantages of the invention will be apparent from the following more particular description of preferred embodiments of the invention, as illustrated in the accompanying drawings.

DESCRIPTION OF THE PREFERRED EMBODIMENTS

Preferred embodiments according to this invention are to be explained with reference to FIG. 1 to FIG. 4.

Explanation will be made to examples of forming semiconductor devices on semiconductor wafers in each of embodiments to be described later but the same method is applicable also to products produced by transferring a pattern formed on an exposure mask by projection and exposure such as magnetic heads of hard disk drives.

Figure 1A:
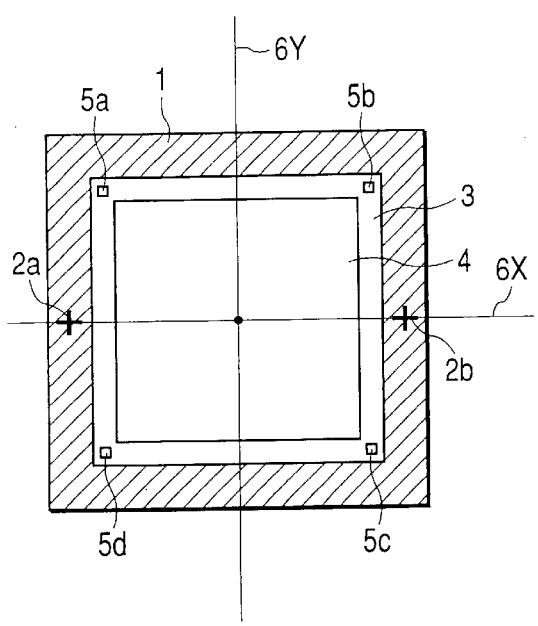
FIG. 1 is a plan view of a mask showing a relative positional displacement between alignment marks and a device area on a mask.
Figure 1B:
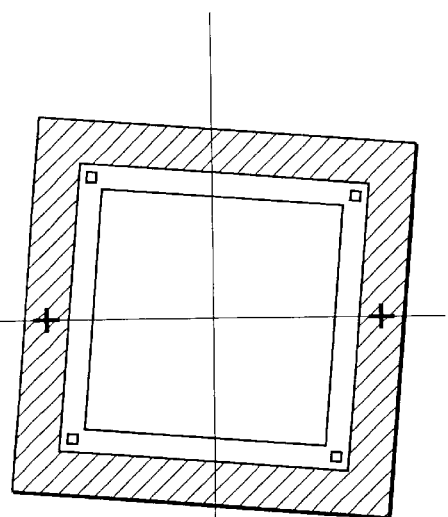
Figure 1C:
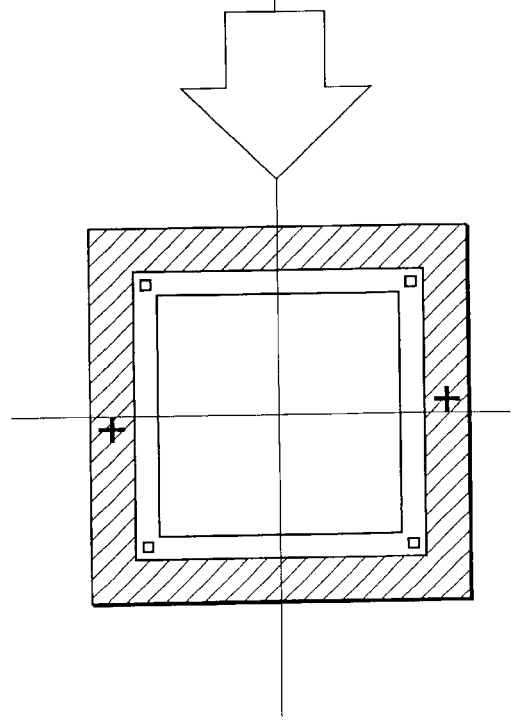

FIGS. 1A to 1C are views for explaining preferred embodiments of a semiconductor device production method in this invention. In the drawing, are shown an exposure mask 1, alignment marks 2a, 2b, an exposure region 3 in which a pattern contained in the region is transferred by an exposure device, for example, to photoresist coated on the surface of a semiconductor wafer, a device area 4 in which a circuit pattern contained in the region is transferred to the photoresist coated on the surface of the wafer and processed to form a circuit pattern of a semiconductor device, marks 5a to 5d for measurement of alignment for measuring alignment with a circuit pattern in a layer already formed in the step before the step as an object for the present exposure and situated below the layer to be exposed in the present step, and reference coordinate system 6X, 6Y.

FIG. 1A shows a positional relation after the alignment in a case where there is no relative positional displacement between the alignment mark and the device area. In this case, the device area is correctly positioned to the reference coordinate system. If this state can be attained in all masks regarding the production steps for the semiconductor devices, no error caused by the mask alignment is caused in the alignment with the circuit pattern formed in the preceding step.

However, as shown in FIG. 1B, if a relative positional displacement is present between the alignment marks 2a, 2b, and the device area 4, even when alignment has been conducted exactly by using the alignment marks 2a, 2b, the device area 4 on the mask 1 causes positional displacement relative to the reference coordinate system. If the relative positional displacement between the alignment marks 2a and 2b and the device area 4 in the exposure mask 1 is different in each of the masks 1 used for each of the steps for the semiconductor device, an alignment error with the pattern formed in the preceding step to be caused may possibly be caused.

However, since the relative positional displacement between the alignment marks 2a and 2b and the device area 4 on the mask 1 is stationary, when the displacement is measured and the adjusting amount for the displacement between the mask coordinate system and the reference coordinate system is corrected upon alignment in the exposure step, the device area 4 can be correctly positioned relative to the reference coordinate system irrespective of the positional displacement between the alignment marks 2a and 2b and the device area 4 on the mask 1, so that the alignment accuracy with the circuit pattern formed in the preceding step can be improved (FIG. 1C).

Figure 2A:
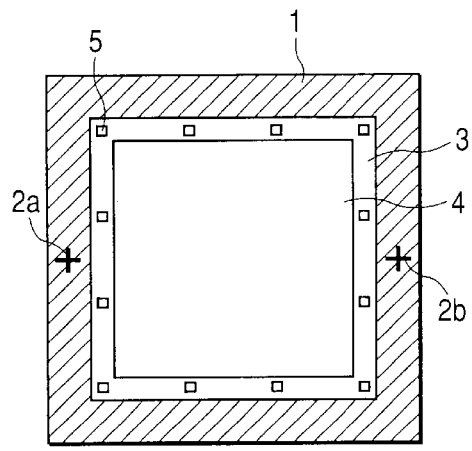
FIG. 2 is a plan view of a mask showing the arrangement of marks for measurement of alignment on a mask.
Figure 2B:
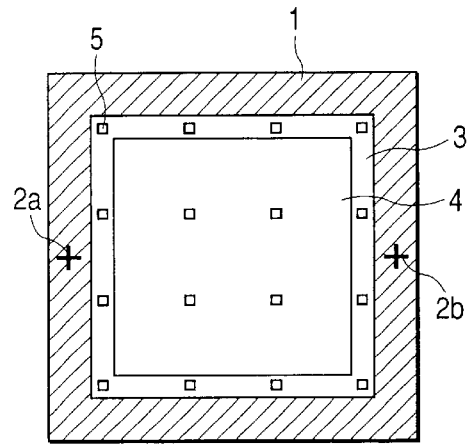

For the measurement of the relative positional displacement between the alignment marks 2a and 2b and the device area 4 on the exposure mask can be conducted easily, a method of measuring the relative position between the alignment measuring marks 5a to 5d surrounding the device area and the alignment marks 2a and 2b can be conducted easily with no requirement for additionally disposing marks for the measurement of positional displacement. Usually, alignment measuring marks 5a to 5d are disposed at four corners of the device area as shown in FIG. 1 but they may be disposed by 4 or more in the periphery of the device area 4 as shown in FIG. 2A or may be disposed in the device area 4 as shown in FIG. 2B.

Figure 3:
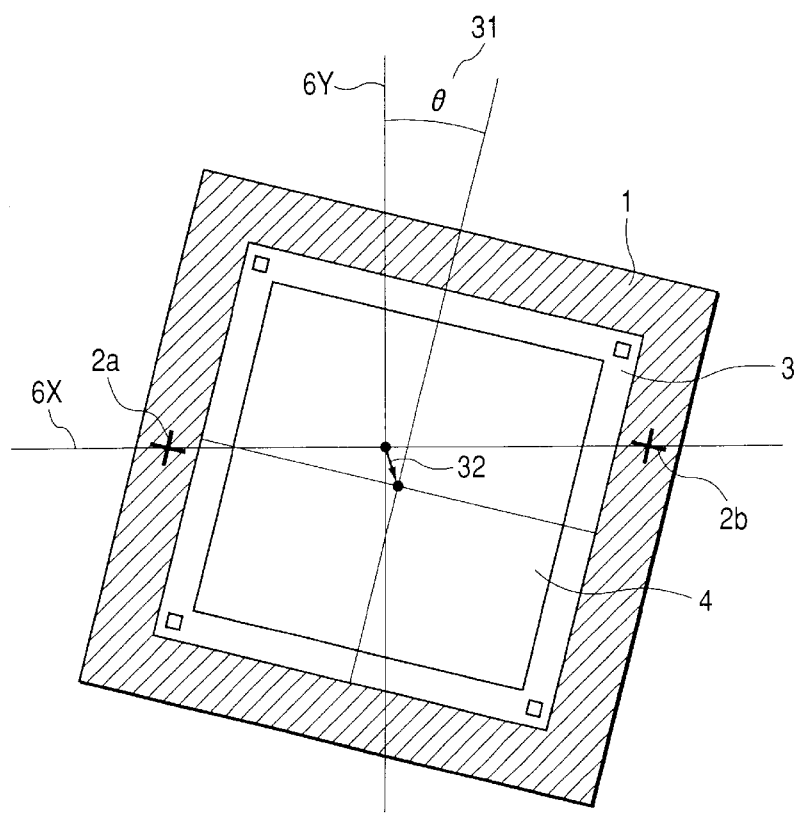
FIG. 3 is a plan view of a mask showing a relative positional displacement between alignment marks and a device area on a mask.

Further, as shown in FIG. 3, when the result of the measurement for the relative positional displacement between the alignment marks 2a and 2b and the device area 4 is expressed by the rotational amount 31 and the shift amount 32 of the device area 4 to the alignment marks 2a and 2b, this is advantageous in applying correction to the mask alignments upon exposure. That is, the result of the measurement for the relative positional displacement between the alignment marks 2a and 2b and the device area 4 can be utilized in the exposure step by defining the amount of displacement between the position for the original point in the mask coordinate system and the position for the original point in the reference coordinate system (vectorial amount) 32 as δ and the amount of rotation of the mask coordinate system to the reference correlation system as θ and recording δ and θ in combination.

The measurement described above is preferably conducted not using the exposure device but is preferably conducted by a coordination measuring system used exclusively by an off line manner. This is because use of the exposure device for the aim other than the exposure to the semiconductor device product is attributable to lowering of the device production efficiency.

The data for the relative positional displacement between the alignment marks 2a and 2b and the device area 4 of the mask 1 measured by the off line manner, that is, the data δ and θ of the shift amount 32 and the rotational amount 31 of the device area 4 relative to the alignment marks 2a and 2b are recorded together with an identification code of the measured mask or preserved by being appended to the measured mask. When exposure is conducted actually by using the mask in the exposure step, the relative positional displacement between the alignment marks 2a and 2b and the device area 4 is corrected by using the previously measured and stored measured data δ and θ for conducting exposure, by which the cause for the alignment error inherent to the mask can be reduced to further decrease the displacement of the exposure under alignment.

Figure 4:
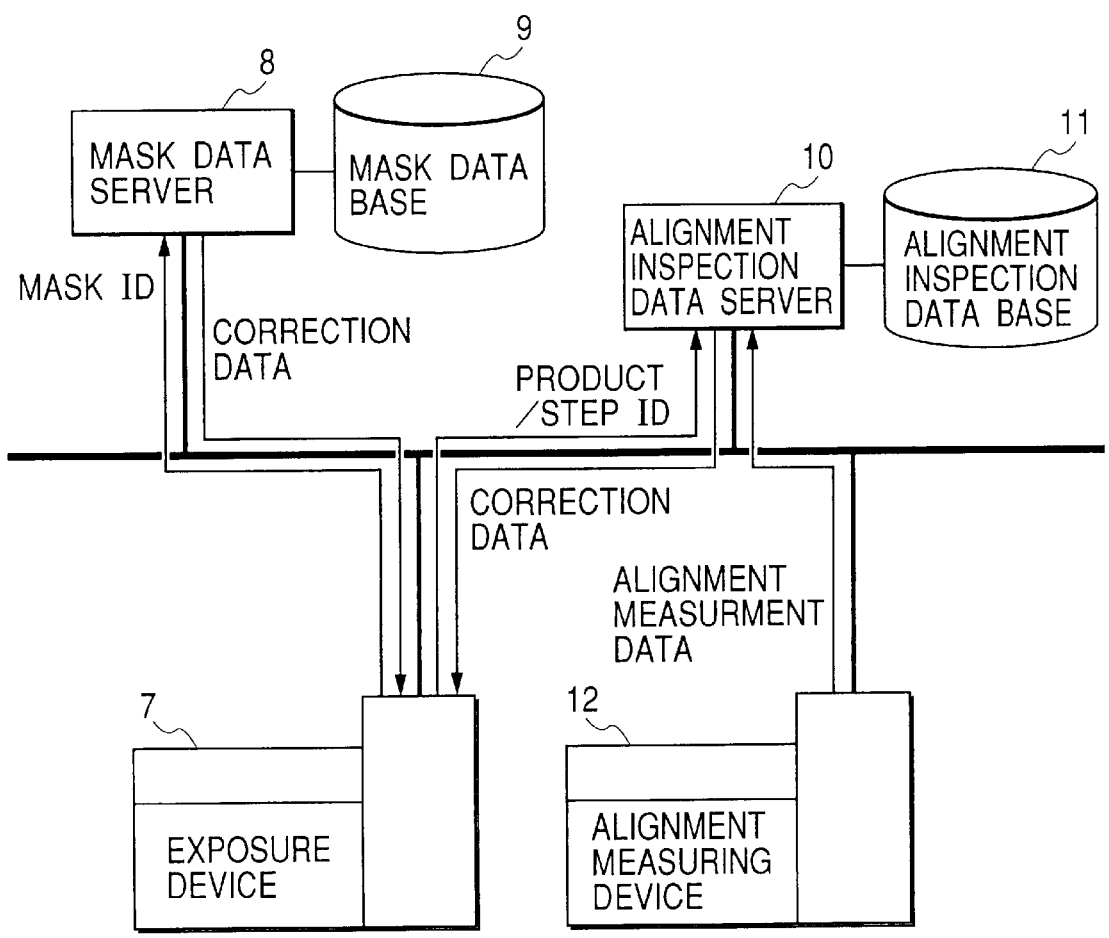
FIG. 4 is a view showing a system constitution of an exposure step according to this invention in the production line for semiconductor devices.
Figure 5:
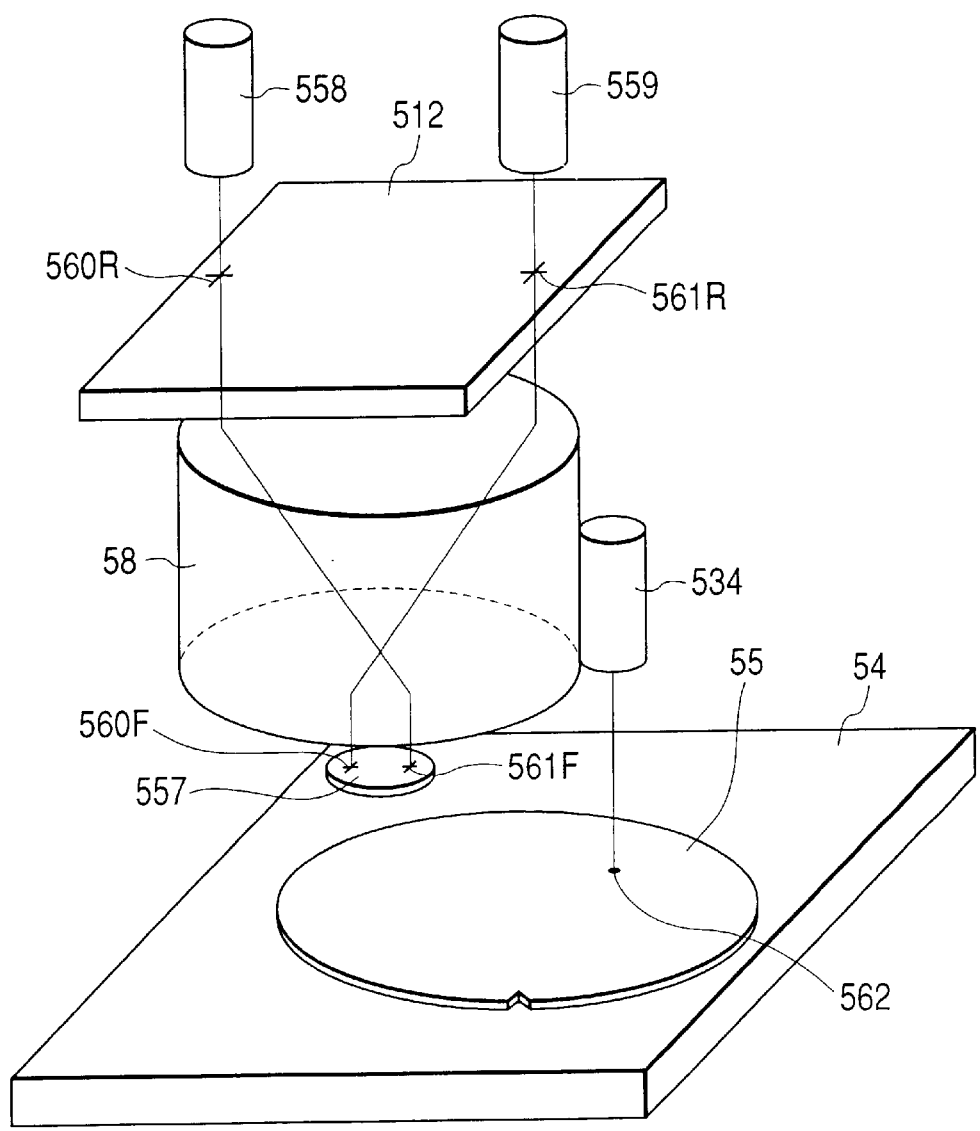
FIG. 5 is a perspective view for the schematic constitution of a projection and exposure device showing relation between alignment marks on each of a mask and a wafer in a projection and exposure device.

A first embodiment of a semiconductor device production system according to this invention is to be explained with reference to FIG. 4. In FIG. 4, are shown an exposure device 7, an alignment inspection device 12, a mask database 9 and a mask data server 8, an alignment inspection data server 10 and an alignment inspection database 11. Each of the devices is connected by way of a network such that various kinds of data can be fetched by way of the network. Further, the exposure device 7 and the alignment inspection device 12 are shown each by one for explanation in FIG. 4 but they may be used in plurality.

The mask database 9 stores the previously measured data δ and θ for relative positional displacement between the alignment marks 2a and 2b and the device area 4 on the mask 1 as explained above and the exposure device 7 can intake the data by way of the mask data server 8. Further, the alignment inspection database 11 is a section for storing the measurement data by way of the alignment inspection device 12. Further, the alignment inspection database 11 is a section for storing the measurement data of the alignment inspection device 12, and the exposure device 7 can intake the data by way of the alignment inspection data server 10.

The operation of this apparatus is to be explained. When exposure in a step is started for a device product, the exposure machine 7 sends a mask ID which is a mask identification code used for the product and the exposure step to the mask data server 8 and the mask data server 8, upon receiving the data, reads out the measurement data δ and θ for the relative displacement between the alignment marks 2a and 2b and the device area 4 of the mask corresponding the mask ID from the mask database 9, coverts the same to mask alignment correction data and send the same to the exposure machine 7. This corrects the error inherent to the product and the step, that is, the positional error of the pattern on the mask.

Further, the exposure machine 7 simultaneously sends the product and step ID to the inspection data server 10 and the inspection data server 10, upon receiving the same, reads out, from the alignment inspection database, alignment inspection data in the past exposure in the apparatus for the product/step corresponding to the product and the step ID and calculates the alignment correction data based thereon and sends the result to the exposure machine 7. This corrects the aging change of the alignment accuracy for the product, step and exposure machine.

This constitution can make various types of alignment correction automatic when conducting exposure in the exposure device, attain high alignment accuracy in the production of semiconductor devices at a high efficiency and restrict the amount of misalignment between upper and lower layers to 20 nm or less.

Measurement for the relative positional displacement between the alignment marks 2a and 2b and the device area 4 of the exposure mask can be conducted during or after the step of producing the mask and the mask can be supplied to the production line for the semiconductor devices in a state of appending the data δ and θ as a result of measurement as quality ensuring data. That is, by adding the result of measurement for δ and θ as the measurement data for the relative positional displacement between the alignment marks 2a and the device area 4 of the exposure mask to the mask data appended so far to the mask used for the production line for semiconductor devices, the factor for causing misalignment inherent to the mask can be decreased easily upon alignment exposure in the production line for semiconductor devices with no preceding operation of using a dummy wafer.

Since determination of data δ and θ for relative positional displacement between the alignment marks 2a and 2b and the device area 4 by previously measuring the mask before use in the production line for semiconductor devices can save the step of determining the amount of correction for displacement by a preceding operation using the exposure device upon alignment exposure as in the prior art, it is particularly desirable in the multiplicity kind small lot production such as system LSI using various kinds and plurality reticules in that the production efficiency of the semiconductor device is not hindered.

In this case, the method for producing the semiconductor device described above can be conducted easily by registering the data δ and θ for relative positional displacement between the alignment marks 2a and 2b and the device area 4 determined by previous measurement as the data for the marks together with other data in the mask database 9 explained previously before or during the use of the mask in the production line for the semiconductor devices.

Then, the constitution of a second embodiment of a semiconductor device production system according to this invention is to be explained with reference to FIG. 6. While it is explained on the premise that each of the devices are connected by way of networks 601, 602 and data can be read out from and written to each other. However, data transfer between the devices is not always restricted to such a system but, for example, a portable recording medium such as a floppy disk may also be used and an operator may input the data on a keyboard provided on each of the devices based on the result outputted from each of the devices.

Figure 10:
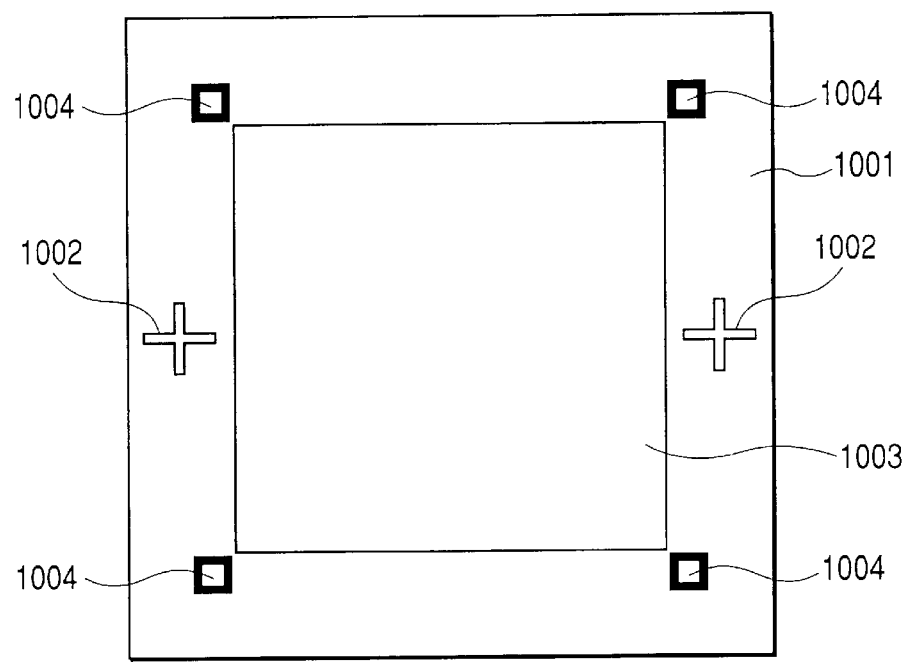
FIG. 10 is a plan view of a mask showing one embodiment for the arrangement of a pattern to be measured on a mask.
Figure 11:
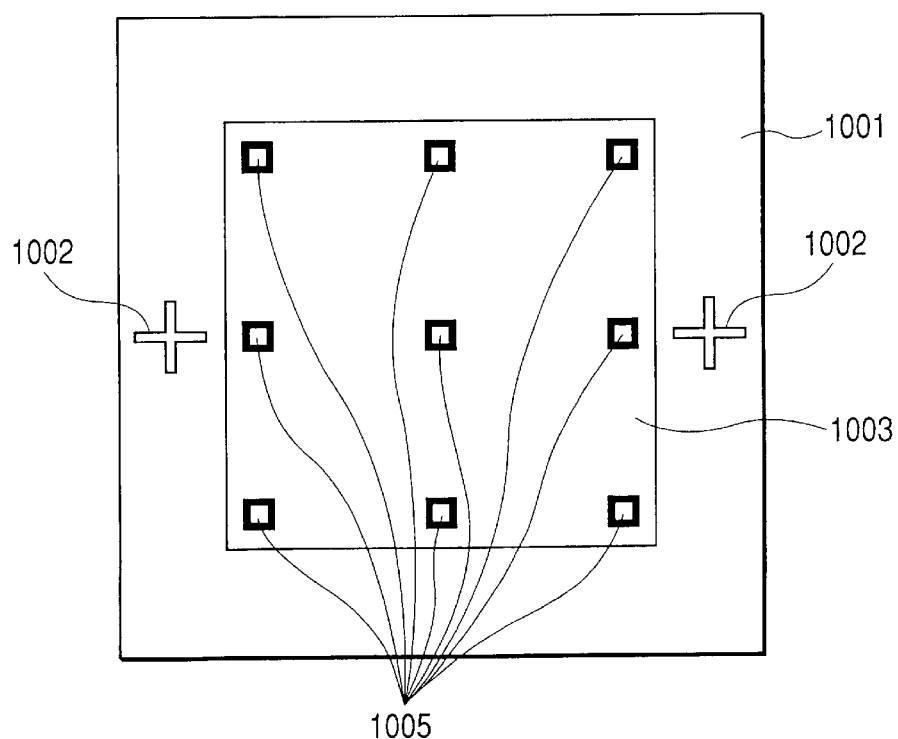
FIG. 11 is a plan view of a mask showing another embodiment for the arrangement of a pattern to be measured on a mask.

A coordinate measuring device 151 measures a pattern position on a mask. The pattern measured in this case is to be explained with reference to FIG. 10 and FIG. 11. In FIG. 10, are shown a mask main body 1001, a mask alignment mark 1002 which is used for mask alignment upon exposure, a device area 1003 in which a pattern formed therein is transferred by an exposure device to a substrate to form a circuit pattern for a semiconductor device and alignment mark measuring marks 1004 for measuring the alignment accuracy of an exposed layer relative to an underlayer. In FIG. 11, those carry identical reference numerals represent identical components in FIG. 10 and 1005 denotes dummy marks for measuring the position for the device area. The dummy marks 1005 may also be served as measurement marks for the alignment accuracy.

Marks to be measured by the coordinate measuring device 151 are mask alignment marks 1002 and alignment measurement marks 1004 or dummy marks 1005.

A mask design information database 130 stores the pattern design values on the mask. The pattern design values include various items and those relevant to this invention are positions in view of the design of the mask alignment marks 1002 and alignment measurement marks 1004 or dummy marks 1006 shown in FIGS. 10 and 11. A mask design information data server 131 inputs/outputs the mask design information.

The result of measurement for the mask alignment marks 1002 and the alignment measurement marks 1004 or the dummy marks 1005 on the mask measured by the coordinate measuring device 151, and the designed positions for mask alignment marks 1002 and the alignment measurement marks 1004 or the dummy marks 1005 stored in the mask design information database 130 are sent to the mask data server 110 and stored in the mask database 111.

The difference as a result of measurement based on the designed pattern position is a positional error for the pattern on the mask, which forms a positional error (alignment error) of the circuit pattern on the substrate of a semiconductor device upon exposure.

When the exposure device 141 conducts exposure, the exposure device 141 sends the mask information used for exposure to the mask data server 110. The mask data server 110 selectively reads out the relevant mask data (positional error information of pattern) from the mask database 111 and sends the same to the correction value calculation server 101. The correction value calculation server 101 calculates an alignment correction value from the sent positional error information for the pattern and sends the same to an exposure device 141. The exposure device 141 writes the sent alignment correction value into an exposure table corresponding to the mask to be used and then conducts exposure. This constitution can correct the positional error for the pattern of the mask and conduct exposure at a high accuracy.

Then, the constitution of a third embodiment of a semiconductor device production system according to this invention is to be explained with reference to FIG. 7. In this example, explanation is to be made, particularly, to an embodiment in which the result of the alignment measurement after exposure is combined with feed back correction. This explanation is to be made on the premise that each of the devices is connected by way of networks 701, 702 and data can be read out and written between each other. However, data transfer between the devices is not always restricted to such a system but, for example, a portable recording medium such as a floppy disk may also be used and an operator may input the data on a keyboard provided on each of the devices based on the result outputted from each of the devices.

Figure 6:
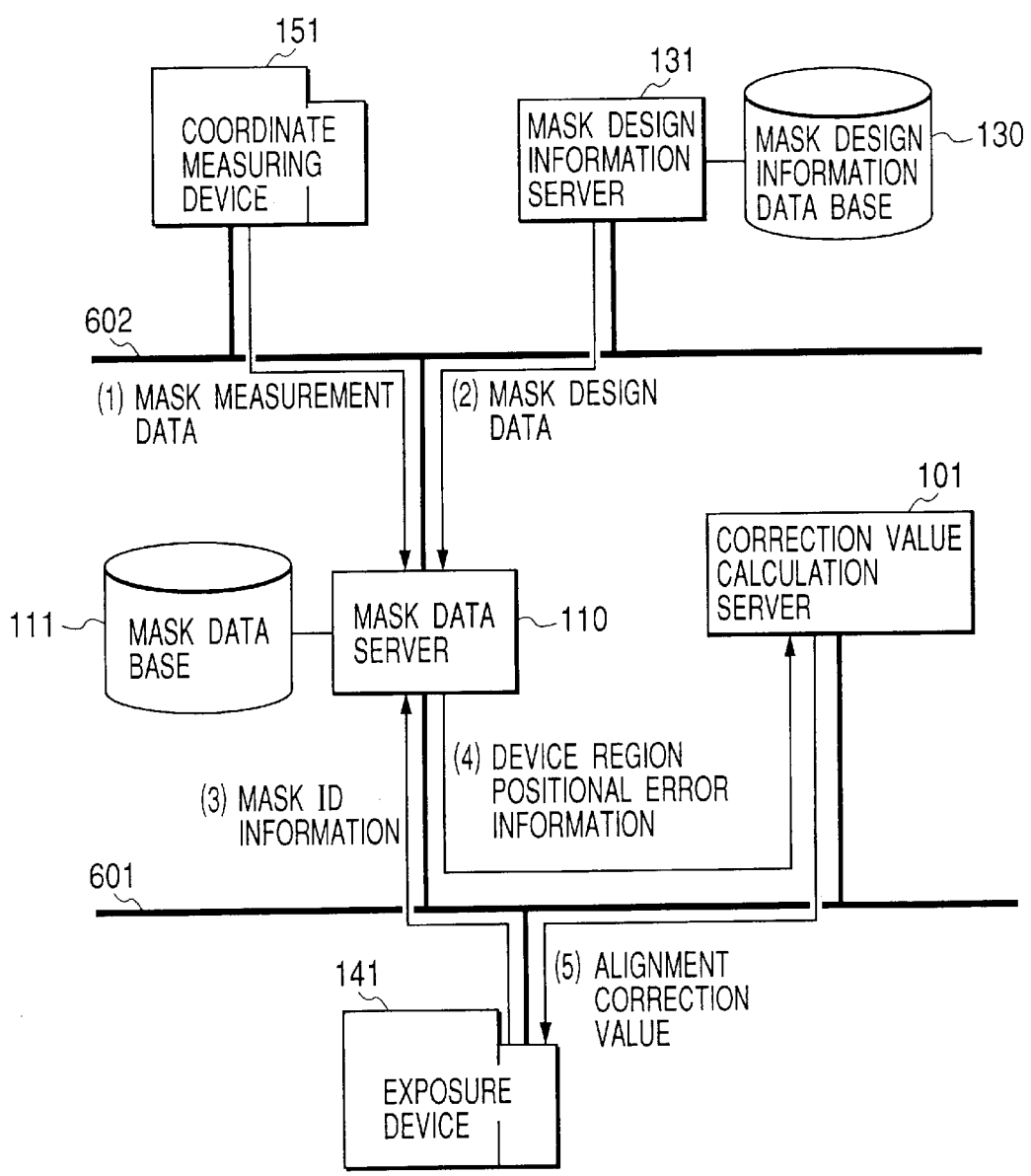
FIG. 6 is a view showing a constitution of a second embodiment for a semiconductor device production system according to this invention.
Figure 7:
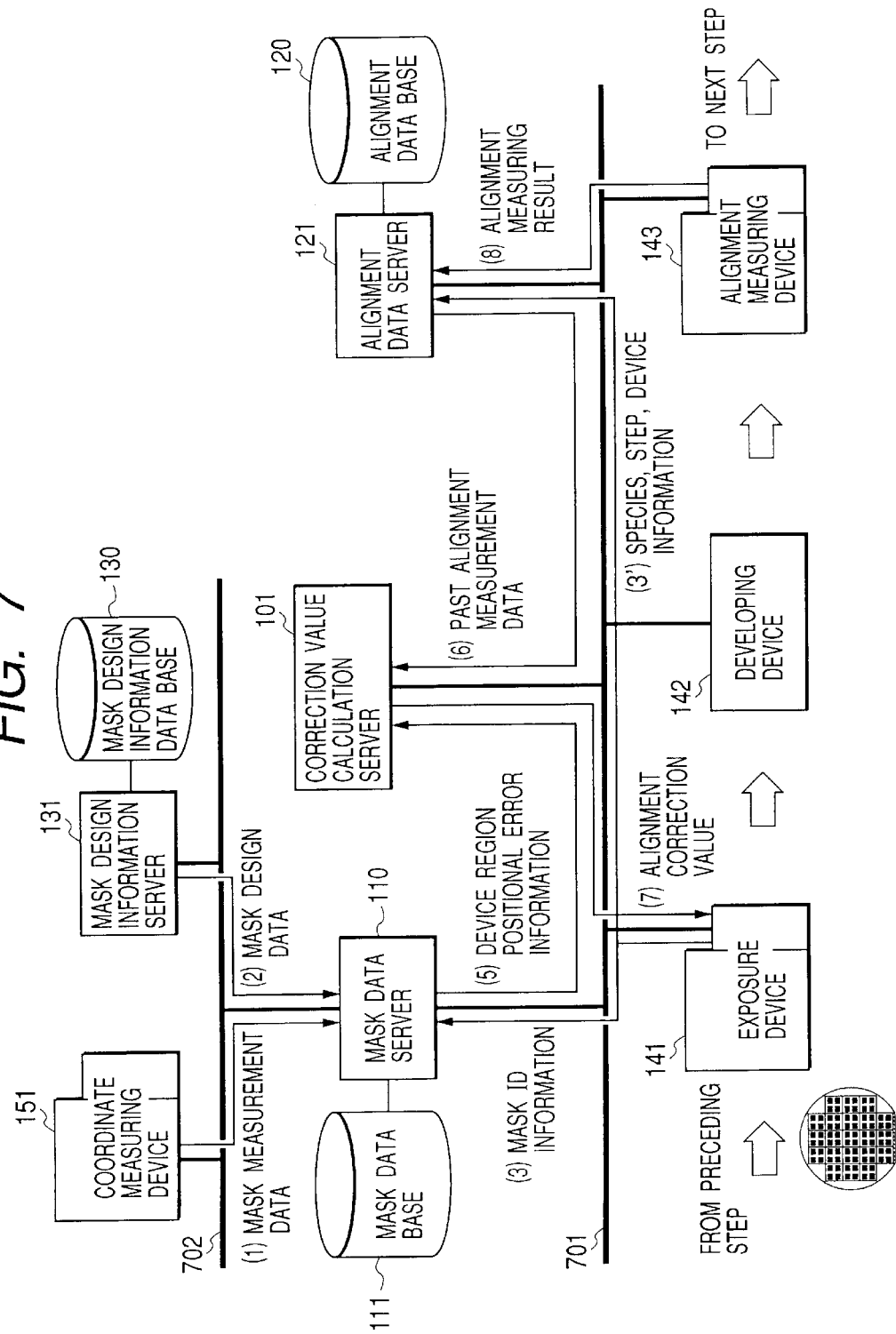
FIG. 7 is a view showing a constitution of a third embodiment for a semiconductor device production system according to this invention.

In FIG. 7, a coordinate measuring device 151 is identical with that in FIG. 6 and measures the pattern position on the mask. A design information database 130 stores the pattern design values on the mask. The result of measurement of the mask alignment mark 1002 and the alignment measurement mark 1004 or the dummy mark 1005 measured by the coordinate measuring device 151 and the design position of the mask alignment mark 1002 and the alignment mark 1004 or the design position of the dummy mark 1005 stored in the mask design information database 130 are sent to the mask data server 110 and stored in the mask database 111.

The wafer exposed in the exposure device 141 is developed by a developing device 142 and alignment accuracy with the underlayer is measured by an alignment measuring device 143. The measured results are collected by the alignment data server 121 and stored in the alignment database 120.

When the exposure device 141 conducts exposure, the exposure device 141 sends the mask information used for exposure to the mask data server 110, and information regarding the kind and the step information for the semiconductor device and the information regarding the exposing device to the alignment data server 121. The mask data server 110 selectively reads out the relevant mask data (positional error information for pattern) from the mask database 111 and sends the same to the correction value calculation server 101. Further, the alignment data server 121 selectively reads out the relevant kind and the step alignment measurement data previously exposed by a corresponding exposure device from the alignment database 120. The correction value calculation server 101 calculates the alignment correction value based on the sent positional sent error information for pattern and alignment measurement data in the past and sends them to the exposure device 141. The exposure device 141 writes the sent alignment correction value to an exposure table corresponding to the mask to be used and then executes the exposure. The constitution described above can also correct the aging change of the exposure device together with the positional error for the pattern of the mask and conducts exposure at high accuracy.

Then, an embodiment for the method for producing semiconductor devices according to this invention is to be explained with reference to FIG. 8.

Figure 8:
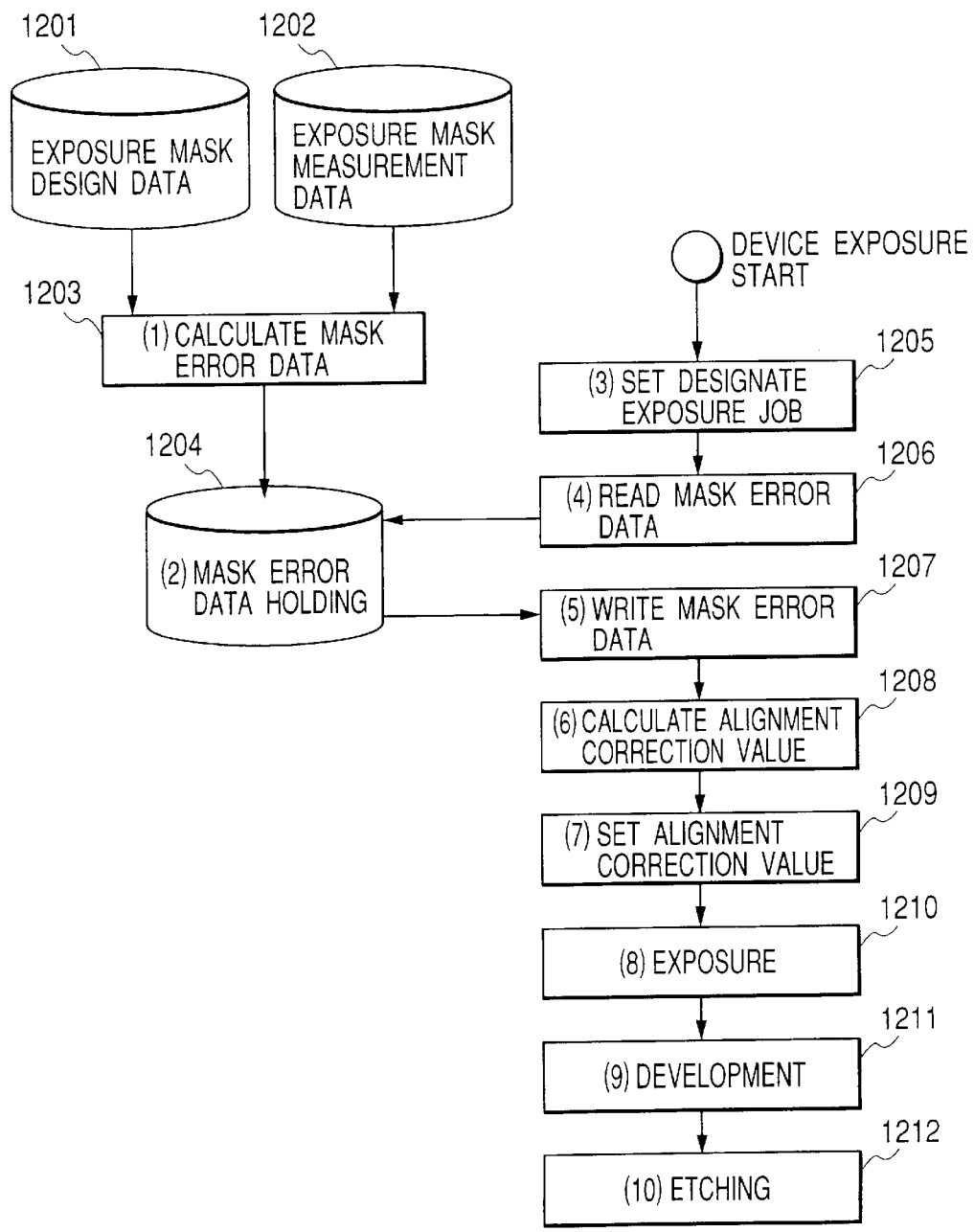
FIG. 8 is a flowchart showing an embodiment for a semiconductor device production system according to this invention.

In FIG. 8, are shown an exposure mask design data 1201, which is data for the designed pattern position and exposure mask measurement data 1202 which is data for the pattern position on an actual mask measured, for example, by a coordinate measuring device. In step (1) for 1203, a difference between the designed data for the exposure mask and the measured data for the exposure mask is determined to calculate mask error data. In step (2) for 1204, the calculated mask error data is stored.

Upon device exposure, an exposure job relevant to the kind and the step for the semiconductor device to be exposed and the mask to be used is designated in step (3) for 1205. In step (4) for 1206, the error data for the mask to be used is read out from the mask error data stored in step (2) for 1204 and the mask error data is written in step (5) for 1207. In step (6) for 1208, the alignment correction value is calculated from the mask error data, the calculated correction value is set in step (7) for 1209 and photoresist coated on the surface of the wafer is exposed in step (8) for 1210.

The constitution described above can correct the pattern positional error of the mask and conduct exposure at high accuracy.

The photoresist of the exposed wafer is developed in step (9) for 1211. Then, etching treatment is applied in step (10) for 1212 in a state where a mask pattern of the photoresist is formed on the wafer. Thus, a pattern is formed on the surface of the wafer.

Figure 9:
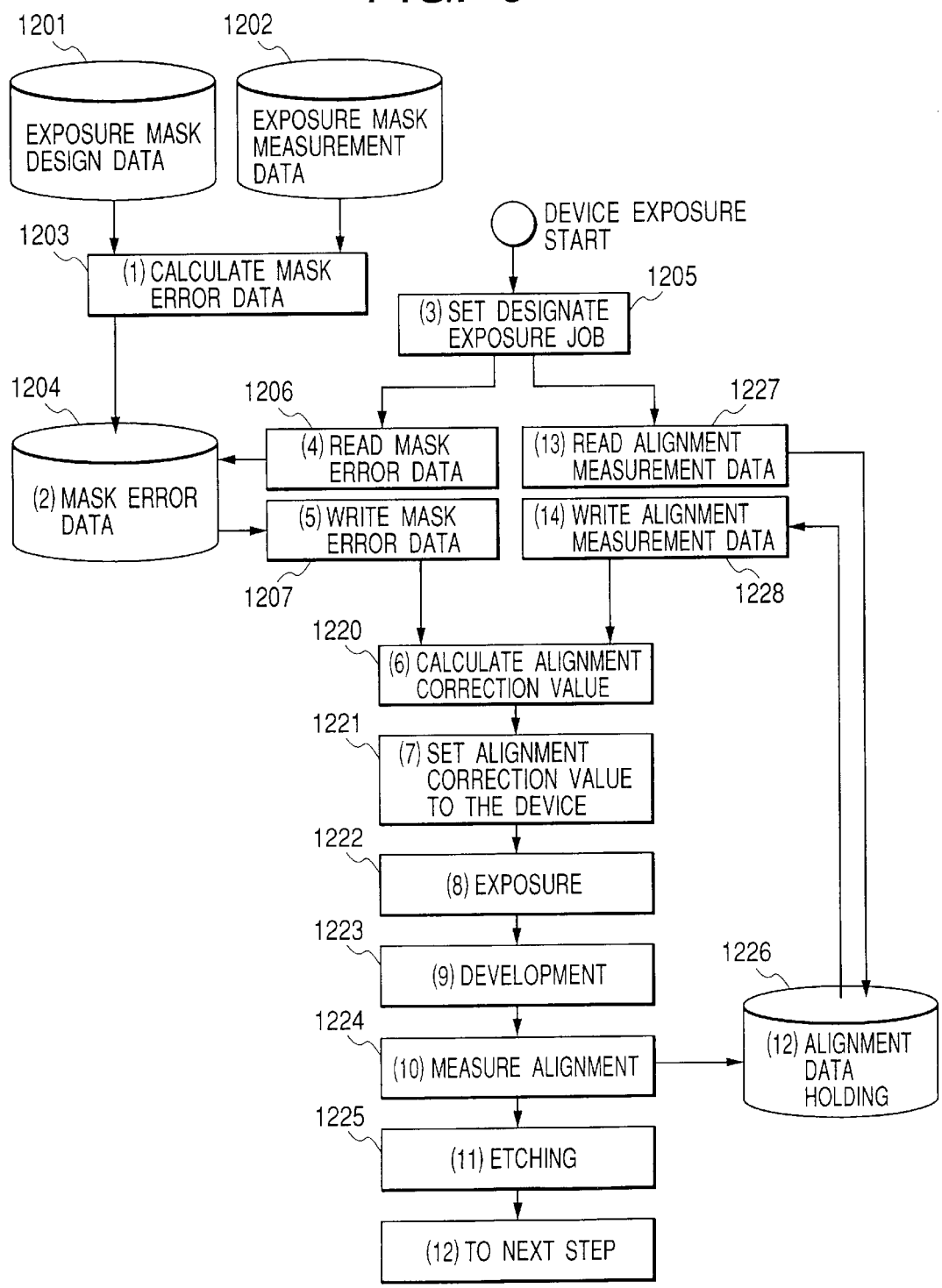
FIG. 9 is a flowchart showing another embodiment for a semiconductor device production system according to this invention.

Another embodiment of a method for producing the semiconductor device according to this invention is to be explained with reference to FIG. 9. In FIG. 9 are shown an exposure mask design data 1201 which is data for the designed pattern position and an exposure mask measurement data 1202 which is data for the pattern position on the actual mask measured by a measuring device or the like.

In step (1) for 1203, a difference between the designed data for the exposure mask and the measured data for the exposure mask is determined to calculate mask error data. In step (2) for 120, the calculated mask error data is stored. In the device exposure, an exposure job relevant to the kind and the step for the semiconductor device to be exposed and the mask to be used is designated (inputted) in step (3) for 1205. In step (4) for 1206, the error data for the mask to be used is read out from the mask data stored in step (2) for 120 and the mask error data is written in step (5) for 1207.

On the other hand, in step (13) for 1227, alignment data regarding the exposed kind and the step in the relevant device in the past is read out and the data is written in step (14) for 1228. In step (6) for 1220, an alignment correction value is calculated from the mask error data and the alignment measurement data, and the calculated correction value is set in step (7) for 1221. Then, in step (8) for 1222, photoresist coated on the surface on the wafer is exposed in a state where alignment is corrected by the set correction value.

The photoresist of the exposed wafer is developed in step (9) for 1223 to form a mask pattern of the photoresist of the wafer. Alignment measurement is conducted instep (10) for 1224 in a state where the mask pattern is formed by development. The measured data is stored in step (12) for 1226, which is utilized as the original data for the alignment correction in subsequent exposure. With the constitution described above, the aging change of the exposing device can also be corrected and exposure can be conducted at a high accuracy together with the positional error for the pattern of the mask.

Then, instep (11) for 1225, an etching treatment is applied to the wafer formed with a mask pattern of the photoresist to form a pattern on the surface of the wafer. The wafer formed with the pattern is transferred to the next step and applied with the next processing treatment.

According to the method of and an apparatus for producing a semiconductor device according to this invention, since a relative positional error between the alignment marks and the device area on the mask is measured and the result of the measurement is set upon exposure as a correction value to the exposing device, even if there is a relative positional error between the alignment marks on the mask and the device area, high alignment accuracy in the device area can be attained. Further, the exposure mask according to this invention provides an advantage that the exposure method described above can be conducted easily.

The invention may be embodied in other specific forms without departing from the spirit or essential characteristics thereof. The present embodiment is therefor to be considered in all respects as illustrative and not restrictive, the scope of the invention being indicated by the appended claims rather than by the foregoing description and all changes which come within the meaning and range of equivalency of the claims are therefor intended to be embraced therein.

What is claimed is:

1. A method for producing a semiconductor device, comprising:
    performing a projection exposure using a projection exposure apparatus in which images of a circuit pattern formed on a device area of a mask are exposed at each predetermined region on a substrate by way of a projection optical system, the performing operation including:

reading mask error data for a subject mask out of a memory unit, the mask error data containing information regarding an error positional displacement of a position of the device area relative to the mask alignment marks including at least shift error data δ and rotation error data θ, for use in corrective optimal alignment of the device area during projection based upon a position of the mask alignment marks;

calculating wafer alignment correction values using the mask error data, with the wafer alignment correction values being useable to correct at least any shift error and any rotation error between the circuit pattern of the mask and each predetermined exposure region of the wafer by way of the projection system in a wafer coordinate system of a wafer stage mountable with a wafer;

positioning the subject mask on a mask stage having a mask coordinate system, using the mask alignment marks; and upon controlling wafer alignment in the wafer coordinate system relative to the mask alignment marks in accordance with the calculated wafer alignment correction values at each predetermined exposure region, exposing the images of the circuit pattern formed on device area of the mask onto photoresist coated on a surface of the wafer within the predetermined exposure region, by way of the projection optical system;

developing the photoresist; and applying an etching treatment to the wafer to form a developed photoresist mask, and using the developed photoresist mask to form at least portions of circuit patterns on the wafer.

2. A method for producing a semiconductor device as defined in claim 1, comprising:

measuring a relative positional displacement of a position of the device area relative to a position of mask alignment marks formed on the mask, by using a coordinate measuring device, and using the same in formation of the mask error data.

3. A method for producing a semiconductor device as defined in claim 2, wherein the position for the device area is determined by measuring device-area-related marks provided in at least one of an area surrounding the device area and within the device area.

4. A method for producing a semiconductor device as defined in claim 2, comprising:

determining the mask error data using a comparison of an actual measured relative positional displacement of a position of the device area relative to a position of mask alignment marks formed on the mask, to a designed relative positional displacement of a position of the device area relative to a position of mask alignment marks of a designed mask, and storing the mask error data in the memory unit.

5. A method for producing a semiconductor device as defined in claim 1, wherein the calculating operation includes calculating and using an overlay positional error data value to correct a overlay positional error between a pattern of an upper layer and a pattern of a lower layer as the result of overlay projection exposure using the projection exposure apparatus.

6. A method for producing a semiconductor device as defined in claim 1, where the mask error data is a permanent mask error data preexistent to said performing operation.

7. A method for producing a semiconductor device as defined in claim 6, where the mask error data for a subject mask is determined at a time off-line from said performing operation.

8. A method for producing a semiconductor device as defined in claim 6, where the mask error data for a subject mask is determined at a time of manufacture of the subject mask.

9. A method for producing a semiconductor device comprising:

performing a projection exposure using a projection exposure apparatus in which images of a circuit pattern formed on a device area of a mask are exposed at each predetermined region on a substrate by way of a projection optical system, the performing operation including:

inputting information regarding a subject mask to be used to perform at least a portion of the projection exposure;

reading mask error data for a subject mask out of a memory region, the mask error data containing information regarding an error positional displacement of a position of the device area relative to the mask alignment marks including at least shift error data δ and rotation error data θ, for use in corrective optimal alignment of the device area during projection based upon a position of the mask alignment marks;

reading overlay positional error data out from a second memory region, the overlay positional error data value to correct a overlay positional error between a pattern of an upper layer and a pattern of a lower layer as the result of overlay projection exposure using the projection exposure apparatus;

upon controlling wafer alignment in a wafer coordinate system relative to the mask alignment marks in accordance with the mask error data and the overlay positional error data at each predetermined exposure region, projecting to expose the images of the circuit pattern formed on device area of the mask onto photoresist coated on a surface of the wafer within the predetermined exposure region, by way of the projection optical system;

developing the exposed photoresist; and applying an etching treatment to the wafer to form a developed photoresist mask, and using the developed photoresist mask to form at least portions of circuit patterns on the wafer.

10. A method for producing a semiconductor device as defined in claim 9, comprising:

measuring a relative positional displacement of a position of the device area relative to a position of mask alignment marks formed on the mask, by using a coordinate measuring device, and using the same in formation of the mask error data.

11. A method for producing a semiconductor device as defined in claim 9, comprising:

determining the mask error data using a comparison of an actual measured relative positional displacement of a position of the device area relative to a position of mask alignment marks formed on the mask, to a designed relative positional displacement of a position of the device area relative to a position of mask alignment marks of a designed mask, and storing the mask error data in the memory unit.

12. A method for producing a semiconductor device as defined in claim 9, where the mask error data is a permanent mask error data preexistent to said performing operation.

13. A method for producing a semiconductor device as defined in claim 12, where the mask error data for a subject mask is determined at a time off-line from said performing operation.

14. A method for producing a semiconductor device as defined in claim 12, where the mask error data for a subject mask is determined at a time of manufacture of the subject mask.

15. A method for producing a semiconductor device comprising:

performing a projection exposure using a projection exposure apparatus in which images of a circuit pattern formed on a device area of a mask are exposed at each predetermined region on a substrate by way of a projection optical system, the performing operation including:

inputting information regarding a subject mask to be used to perform at least a portion of the projection exposure;

reading mask error data for a subject mask out of a memory unit, the mask error data containing information regarding an error positional displacement of a position of the device area relative to the mask alignment marks including at least shift error data δ and rotation error data θ, for use in corrective optimal alignment of the device area during projection based upon a position of the mask alignment marks;

reading overlay positional error data out from a second memory region, the overlay positional error data value to correct a overlay positional error between a pattern of an upper layer and a pattern of a lower layer as the result of overlay projection exposure using the projection exposure apparatus;

calculating wafer alignment correction values using the mask error data and the overlay positional error data value, with the wafer alignment correction values being useable to correct at least any shift error, rotation error and overlay positional error between the circuit pattern of the mask and each predetermined exposure region of the wafer by way of the projection system in a wafer coordinate system of a wafer stage mountable with a wafer;

positioning the subject mask on a mask stage having a mask coordinate system, using the mask alignment marks; and upon controlling wafer alignment in the wafer coordinate system relative to the mask alignment marks in accordance with the calculated wafer alignment correction values at each predetermined exposure region, exposing the images of the circuit pattern formed on device area of the mask onto photoresist coated on a surface of the wafer within the predetermined exposure region, by way of the projection optical system;

developing the photoresist; and applying an etching treatment to the wafer to form a developed photoresist mask, and using the developed photoresist mask to form at least portions of circuit patterns on the wafer.

16. A method for producing a semiconductor device as defined in claim 15, comprising:

measuring a relative positional displacement of a position of the device area relative to a position of mask alignment marks formed on the mask, by using a coordinate measuring device, and using the same in formation of the mask error data.

17. A method for producing a semiconductor device as defined in claim 15, comprising:

determining the mask error data using a comparison of an actual measured relative positional displacement of a position of the device area relative to a position of mask alignment marks formed on the mask, to a designed relative positional displacement of a position of the device area relative to a position of mask alignment marks of a designed mask, and storing the mask error data in the memory unit.

18. A method for producing a semiconductor device as defined in claim 15, where the mask error data is a permanent mask error data preexistent to said performing operation.

19. A method for producing a semiconductor device as defined in claim 18, where the mask error data for a subject mask is determined at a time off-line from said performing operation.

20. A method for producing a semiconductor device as defined in claim 18, where the mask error data for a subject mask is determined at a time of manufacture of the subject mask.

* * * * *